(12) United States Patent
Aram

(10) Patent No.: US 10,348,259 B2
(45) Date of Patent: Jul. 9, 2019

(54) ACTIVE DEVICE WHICH HAS A HIGH BREAKDOWN VOLTAGE, IS MEMORY-LESS, TRAPS EVEN HARMONIC SIGNALS AND CIRCUITS USED THEREWITH

(71) Applicant: Ethertronics, Inc., San Diego, CA (US)

(72) Inventor: Farbod Aram, Los Altos Hills, CA (US)

(73) Assignee: Ethertronics, Inc., San Diego, CA (US)

( * ) Notice: Subject to any disclaimer, the term of this patent is extended or adjusted under 35 U.S.C. 154(b) by 0 days.

(21) Appl. No.: 15/978,636

(22) Filed: May 14, 2018

(65) Prior Publication Data

US 2018/0262172 A1    Sep. 13, 2018

Related U.S. Application Data

(63) Continuation of application No. 15/367,995, filed on Dec. 2, 2016, now Pat. No. 10,003,314, which is a
(Continued)

(51) Int. Cl.
*H03F 3/191* (2006.01)
*H03G 1/00* (2006.01)
(Continued)

(52) U.S. Cl.
CPC ......... *H03G 1/0029* (2013.01); *H03F 1/0205* (2013.01); *H03F 1/26* (2013.01);
(Continued)

(58) Field of Classification Search
CPC ....................................................... H03F 3/191
(Continued)

(56) References Cited

U.S. PATENT DOCUMENTS 3,370,242 A    2/1968   Offner
3,479,553 A    11/1969  Yanishevsky et al.
(Continued)

FOREIGN PATENT DOCUMENTS

EP    2 079 162       7/2009
WO   WO 2012/088523  6/2012

OTHER PUBLICATIONS

Thongleam et al., "A 0.8 V Quasi-Floating-Gate Fully Differential CMOS Op-Amp with Positive Feedback," The 8th Electrical Engineering/Electronics, Computer, Telecommunications and Information Technology (ECTI) Association of Thailand—Conference 2011, May 17, 2011, pp. 98-101.

*Primary Examiner* — Henry Choe
(74) *Attorney, Agent, or Firm* — Dority & Manning, P.A.

(57) ABSTRACT

An active device and circuits utilized therewith are disclosed. In an aspect, the active device comprises an n-type transistor having a drain, gate and bulk and a p-type transistor having a drain, gate and bulk. The n-type transistor and the p-type transistor include a common source. The device includes a first capacitor coupled between the gate of the n-type transistor and the gale of the p-type transistor, a second capacitor coupled between the drain of the n-type transistor and the drain of p-type transistor and a third capacitor coupled between the bulk of the n-type transistor and the bulk of p-type transistor. The active device has a high breakdown voltage, is memory less and traps even harmonic signals.

9 Claims, 16 Drawing Sheets

Related U.S. Application Data continuation of application No. 14/745,261, filed on Jun. 19, 2015, now Pat. No. 9,543,916.

(60) Provisional application No. 62/014,575, filed on Jun. 19, 2014.

(51) Int. Cl.

| | |
|---|---|
| *H03F 1/32* | (2006.01) |
| *H03F 3/45* | (2006.01) |
| *H03F 3/193* | (2006.01) |
| *H03F 3/21* | (2006.01) |
| *H03F 1/02* | (2006.01) |
| *H03F 1/26* | (2006.01) |
| *H03F 1/56* | (2006.01) |

(52) U.S. Cl.
CPC .......... *H03F 1/3205* (2013.01); *H03F 1/565* (2013.01); *H03F 3/193* (2013.01); *H03F 3/21* (2013.01); *H03F 3/211* (2013.01); *H03F 3/4521* (2013.01); *H03F 3/45179* (2013.01); *H03F 3/45183* (2013.01); *H03G 1/0005* (2013.01); *H03F 2200/213* (2013.01); *H03F 2200/294* (2013.01); *H03F 2200/387* (2013.01); *H03F 2200/451* (2013.01); *H03F 2200/537* (2013.01); *H03F 2200/72* (2013.01); *H03F 2200/75* (2013.01); *H03F 2203/45306* (2013.01); *H03F 2203/45481* (2013.01)

(58) Field of Classification Search
USPC .......................................... 330/305, 311, 302
See application file for complete search history.

(56) References Cited

U.S. PATENT DOCUMENTS

| | | | |
|---|---|---|---|
| 4,146,844 A | 3/1979 | Quin | |
| 4,459,496 A | 7/1984 | Yamada et al. | |
| 5,537,079 A | 7/1996 | Gosser et al. | |
| 5,838,031 A | 11/1998 | Kobayashi et al. | |
| 5,838,807 A | 11/1998 | Andersson et al. | |
| 5,847,600 A | 12/1998 | Brooks et al. | |
| 6,366,170 B1 | 4/2002 | Maida | |
| 6,492,870 B2 | 12/2002 | Escobar-Bowser | |
| 6,680,657 B2 | 1/2004 | Wang | |
| 6,696,888 B2 | 2/2004 | Gilbert | |
| 6,760,381 B2 | 7/2004 | Lu | |
| 6,801,084 B2 | 10/2004 | Smith et al. | |
| 6,839,015 B1 | 1/2005 | Sutardja et al. | |
| 6,891,419 B2 * | 5/2005 | Kartschoke | H03K 3/0375 327/208 |
| 6,924,701 B1 | 8/2005 | Bhandari | |
| 7,023,271 B1 | 4/2006 | Aram | |
| 7,068,104 B2 | 6/2006 | Burns et al. | |
| 7,102,342 B2 | 6/2006 | Kim | |
| 7,076,226 B2 | 7/2006 | Bult et al. | |
| 7,109,793 B2 | 9/2006 | Nakatani et al. | |
| 7,119,612 B1 | 10/2006 | Holloway et al. | |
| 7,202,726 B2 | 4/2007 | Kunanayagam et al. | |
| 7,202,733 B1 | 4/2007 | Aram | |
| 7,205,837 B2 | 4/2007 | Cohen | |
| 7,215,201 B2 * | 5/2007 | Roine | H03F 3/193 330/255 |
| 7,215,206 B2 | 5/2007 | Dupuis | |
| 7,312,659 B1 | 12/2007 | Aram et al. | |
| 7,323,930 B2 | 1/2008 | Aram et al. | |
| 7,369,008 B2 | 5/2008 | Masai | |
| 7,386,280 B2 | 6/2008 | Kappes et al. | |
| 7,391,262 B2 | 6/2008 | Zhang | |
| 7,392,028 B2 | 6/2008 | Goddard | |
| 7,414,481 B2 | 8/2008 | Li et al. | |
| 7,425,871 B2 | 9/2008 | Gao et al. | |
| 7,433,662 B2 | 10/2008 | Behzad et al. | |
| 7,529,529 B2 | 5/2009 | Taylor | |
| 7,554,072 B2 | 6/2009 | Schmidt | |
| 7,573,331 B2 | 8/2009 | Nainar | |
| 7,671,686 B2 | 3/2010 | Kuo et al. | |
| 7,672,659 B2 | 3/2010 | Mattisson | |
| 7,714,644 B2 | 5/2010 | Takemoto et al. | |
| 7,764,124 B2 | 7/2010 | Aram | |
| 7,795,960 B2 | 9/2010 | Lyden et al. | |
| 7,821,349 B2 | 10/2010 | Park et al. | |
| 7,826,816 B2 | 11/2010 | Zhuo et al. | |
| 7,834,690 B2 | 11/2010 | Aram | |
| 7,834,691 B2 | 11/2010 | Aram | |
| 7,868,701 B2 | 1/2011 | Nakamura et al. | |
| 7,885,626 B2 | 2/2011 | Tanaka et al. | |
| 7,891,262 B2 | 2/2011 | Hayakawa et al. | |
| 7,920,030 B2 | 4/2011 | Jang et al. | |
| 7,940,122 B2 | 5/2011 | Satou | |
| 7,949,322 B2 | 5/2011 | Kim et al. | |
| 7,952,430 B1 | 5/2011 | Beffa | |
| 8,049,566 B1 | 11/2011 | Aram | |
| 8,058,938 B2 | 11/2011 | Aga et al. | |
| 8,081,032 B1 | 11/2011 | Aram | |
| 8,143,946 B2 | 3/2012 | Aram | |
| 8,150,352 B1 | 4/2012 | Aga et al. | |
| 8,378,750 B2 | 2/2013 | Sutardja et al. | |
| 8,524,487 B2 | 9/2013 | Fife | |
| 9,543,916 B2 | 1/2017 | Aram | |
| 2002/0079975 A1 | 6/2002 | Asikainen et al. | |
| 2003/0067042 A1 | 4/2003 | Kaatz | |
| 2003/0227336 A1 | 12/2003 | Wang et al. | |
| 2006/0028283 A1 | 2/2006 | Sze et al. | |
| 2006/0097801 A1 | 5/2006 | Adan | |
| 2006/0186957 A1 | 8/2006 | Mattison | |
| 2006/0202773 A1 | 9/2006 | Masai et al. | |
| 2006/0284679 A1 | 12/2006 | Roine | |
| 2007/0040609 A1 | 2/2007 | Taylor | |
| 2007/0182503 A1 | 8/2007 | Petrofsky | |
| 2007/0247237 A1 | 10/2007 | Mohammadi | |
| 2008/0079494 A1 | 4/2008 | Aram | |
| 2008/0238566 A1 | 10/2008 | Sano et al. | |
| 2008/0272851 A1 | 11/2008 | Lin et al. | |
| 2009/0140808 A1 | 6/2009 | Mak et al. | |
| 2009/0174480 A1 | 7/2009 | Lee | |
| 2010/0277250 A1 | 11/2010 | Aga et al. | |
| 2010/0329157 A1 | 12/2010 | Xing et al. | |
| 2011/0221530 A1 | 9/2011 | Sutardja et al. | |
| 2011/0018625 A1 | 11/2011 | Hodel | |
| 2013/0169364 A1 * | 7/2013 | Cha | H03F 1/223 330/261 |

\* cited by examiner

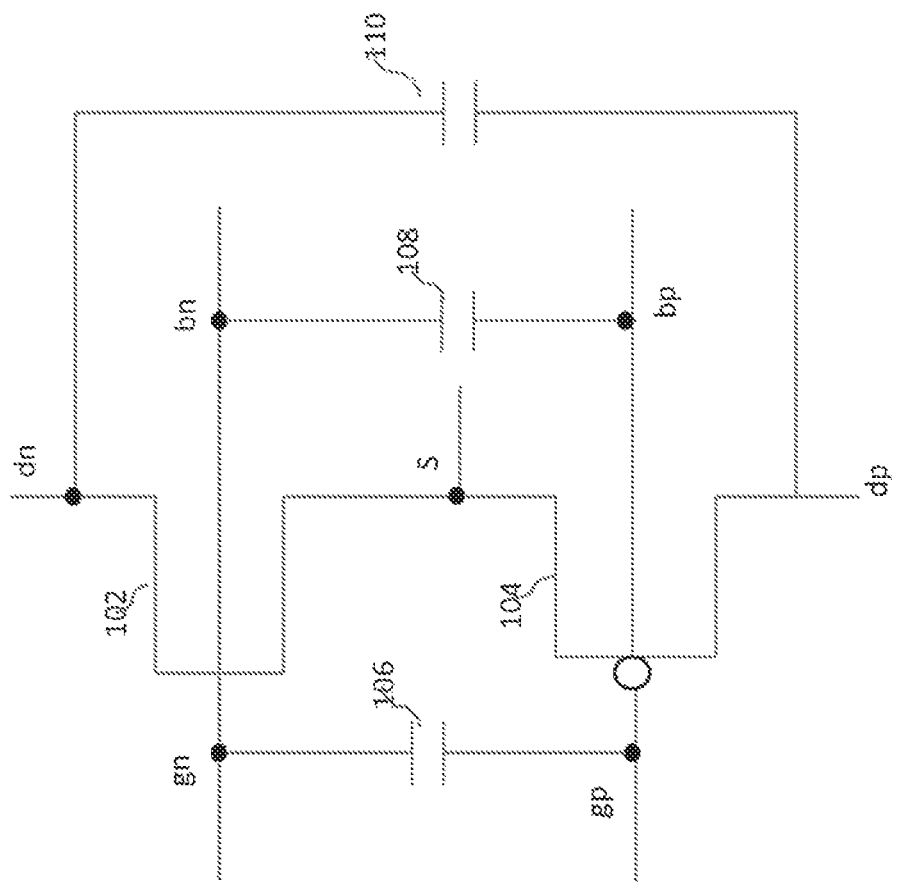
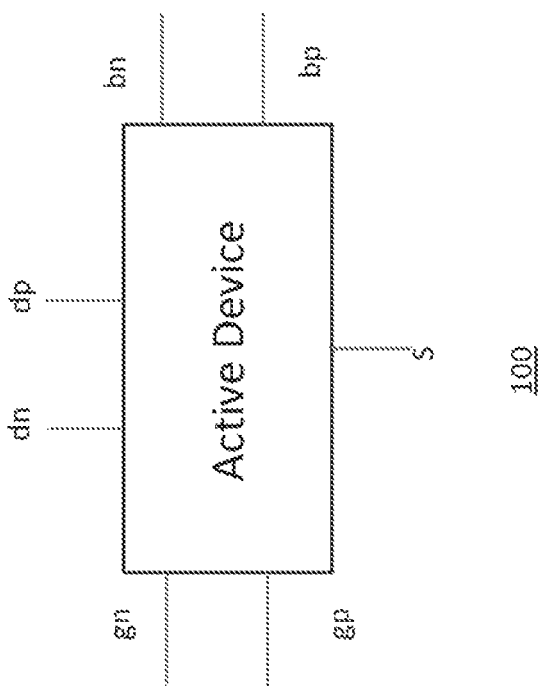
Figure 1A
Figure 1B

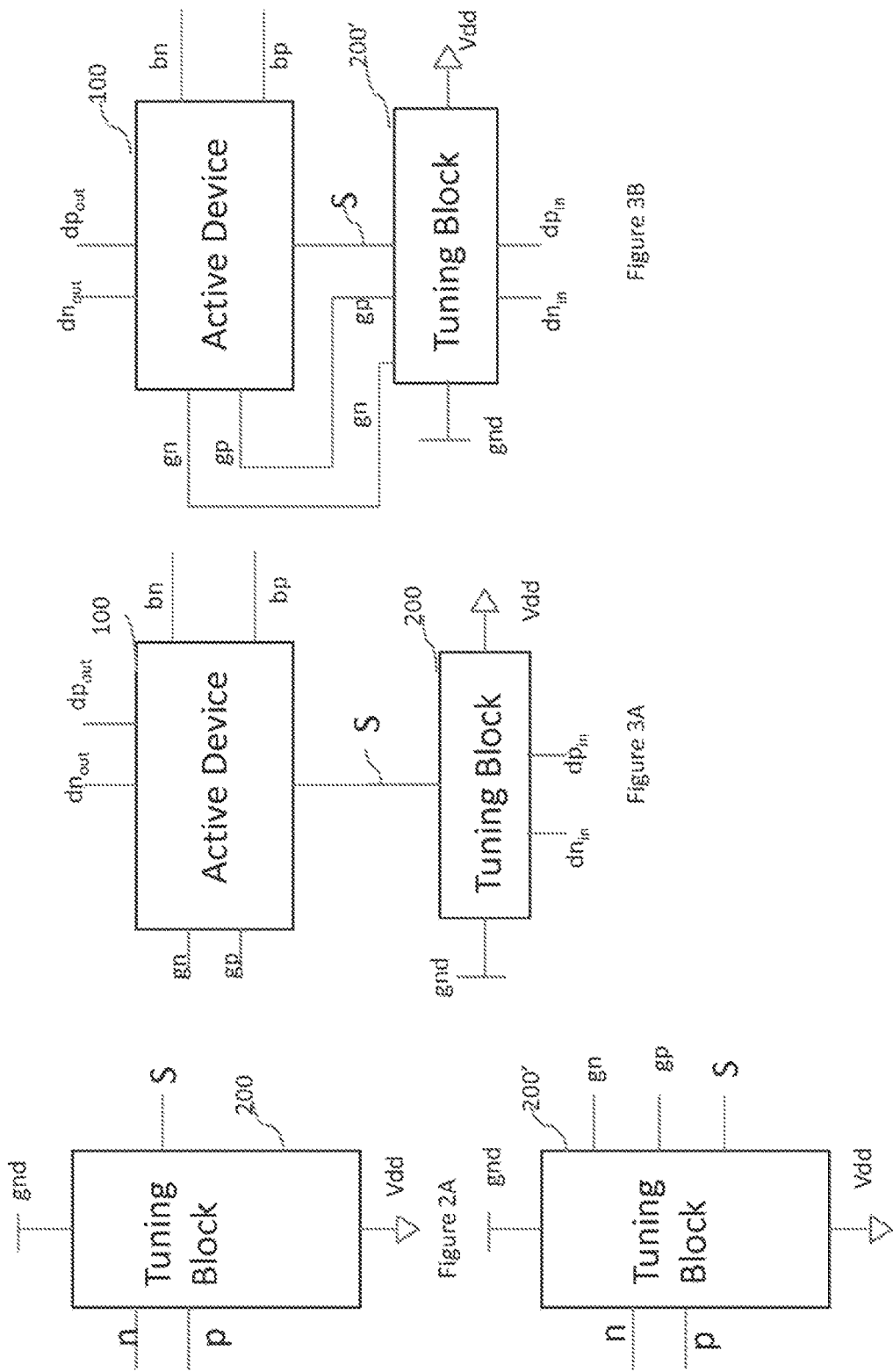

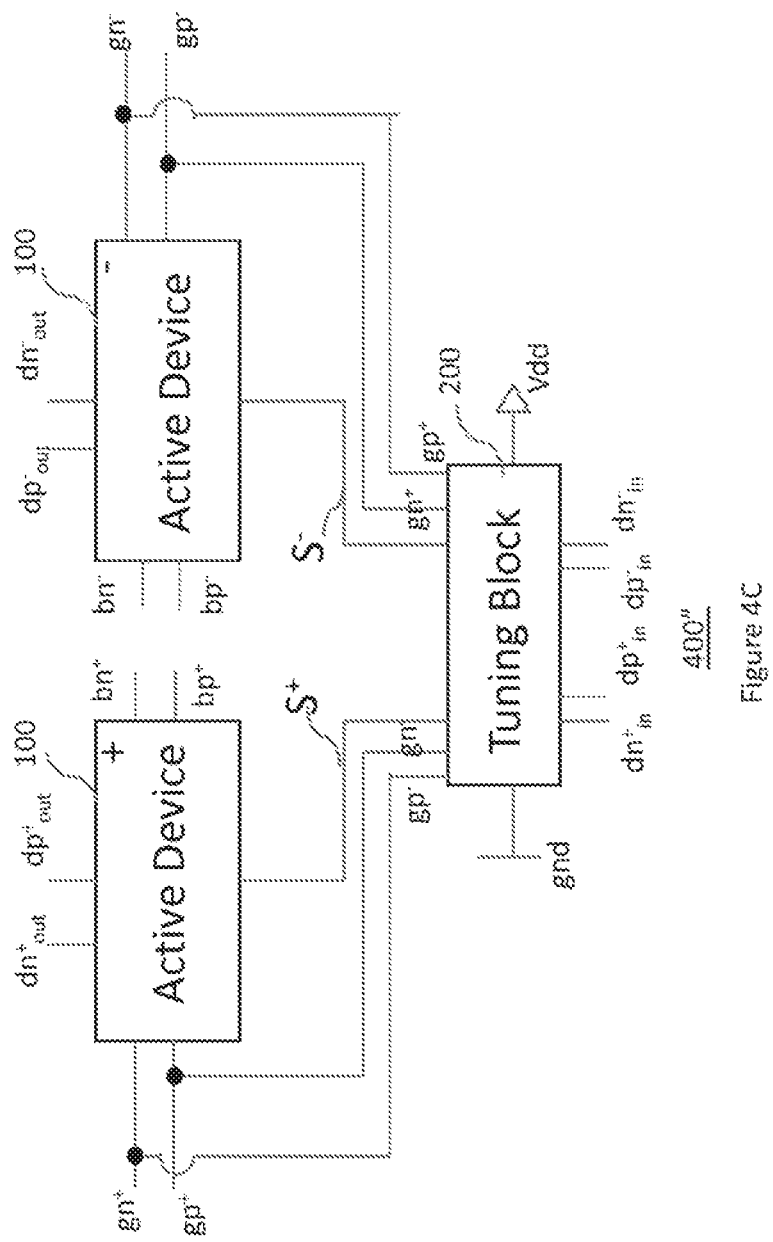

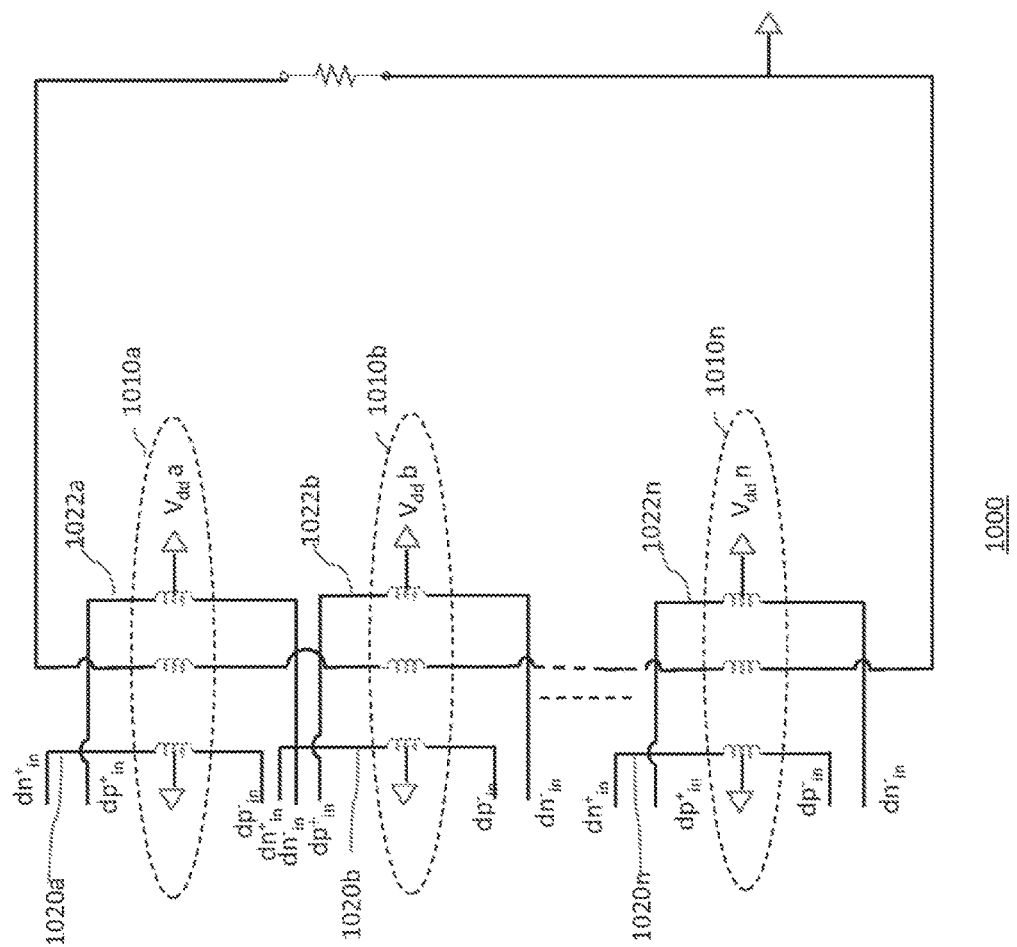

ACTIVE DEVICE WHICH HAS A HIGH BREAKDOWN VOLTAGE, IS MEMORY-LESS, TRAPS EVEN HARMONIC SIGNALS AND CIRCUITS USED THEREWITH

CROSS-REFERENCE TO RELATED APPLICATION

The present application is a continuation of U.S. application Ser. No. 15/367,995, filed on Dec. 2, 2016, entitled "ACTIVE DEVICE WHICH HAS A HIGH BREAKDOWN VOLTAGE, IS MEMORY-LESS, TRAPS EVEN HARMONIC SIGNALS AND CIRCUITS USED THEREWITH," which is a continuation of Ser. No. 14/745,261, filed Jun. 19, 2015, entitled "ACTIVE DEVICE WHICH HAS A HIGH BREAKDOWN VOLTAGE, IS MEMORYLESS, TRAPS EVEN HARMONIC SIGNALS AND CIRCUITS USED THEREWITH," which claims benefit under 35 USC 119(e) of U.S. Provisional Patent Application No. 62/014,575, filed on Jun. 19, 2014, entitled "BROADBAND HIGHLY LINEAR LOW NOISE AMPLIFIER," which is incorporated herein by reference in its entirety. This application is related to U.S. Pat. No. 7,764,124, issued Jul. 27, 2010, U.S. Pat. No. 7,834,690, issued Nov. 16, 2010, U.S. Pat. No. 7,834,691, issued Nov. 16, 2010, U.S. Pat. No. 8,049,566, issued Nov. 1, 2011, U.S. Pat. No. 8,058,938, issued Nov. 15, 2011, U.S. Pat. No. 8,081,032, issued Dec. 20, 2011, U.S. Pat. No. 8,143,946, issued Mar. 27, 2012, and U.S. Pat. No. 8,150,352, issued Apr. 3, 2012.

FIELD OF THE INVENTION

The present invention relates generally to wireless devices and more particularly to an amplifier circuits utilized in such devices.

BACKGROUND

Wireless products are utilised in a variety of environments such as mobile (for example cellular and Wi-Fi for handsets) or non-mobile (for example Wi-Fi for access points and routers). Amplifiers are utilized in such products to amplify the signals received or transmitted therefrom. As the market for wireless products develops there becomes an ever increasing need for more bandwidth and more data across mobile and non-mobile networks with more demand for higher efficiency and linearity. Therefore the communication of such data over these networks is becoming more and more difficult. For example, as the bandwidth goes up as network evolves, and at the same time the signals consolations become more dense. As a result, there is a requirement of more linearity of the output signals from devices. What is meant by linearity is increase an ability to increase the power level of an input signal without otherwise altering the content of the signal.

Hence, because signals are mere clustered it has become more difficult to maintain linearity and still provide accurate information. Therefore, it is important to provide amplifiers that maintain linearity as bandwidth and signal complexity increases. Devices and circuits in accordance with the present invention address such a need.

SUMMARY

An active device and circuits utilized therewith are disclosed. In a first aspect, the active device comprises an n-type transistor having a drain, gate, bulk and source and a p-type transistor having a drain, gate, bulk and source. The n-type transistor and the p-type transistor include a common source. The device includes a first capacitor coupled between the gate of the n-type transistor and the gate of the p-type transistor, a second capacitor coupled between the drain of the n-type transistor and the drain of p-type transistor and a third capacitor coupled between the bulk of the n-type transistor and the bulk of p-type transistor. The active device has a high breakdown voltage since each n-type and p-type device see a portion of total power supply voltage, is memory less and traps even harmonic, signals. This combination of n-type and p-type also distinguish between even and odd signals that are generated during class AB or B or C, operation.

BRIEF DESCRIPTION OF THE DRAWINGS

FIG. 1A is a schematic diagram of an active device in accordance with the present invention.

FIG. 1B is a block diagram of the active device shown in FIG. 1A.

FIG. 2A is a first embodiment of a tuning block in accordance with the present invention.

FIG. 2B is a second embodiment of a tuning block in accordance with the present invention.

FIG. 3A is a block diagram of a common gate amplifier in accordance with the present invention.

FIG. 3B is a block diagram of a combined common gate and common source amplifier in accordance with the present invention.

FIG. 4C is a block diagram of an embodiment of a differential combined common gate and common source amplifier in accordance with the present invention

FIG. 10A is a second embodiment of a schematic diagram of the load of FIG. 8 in accordance with the present invention.

DETAILED DESCRIPTION

Figure 4A:
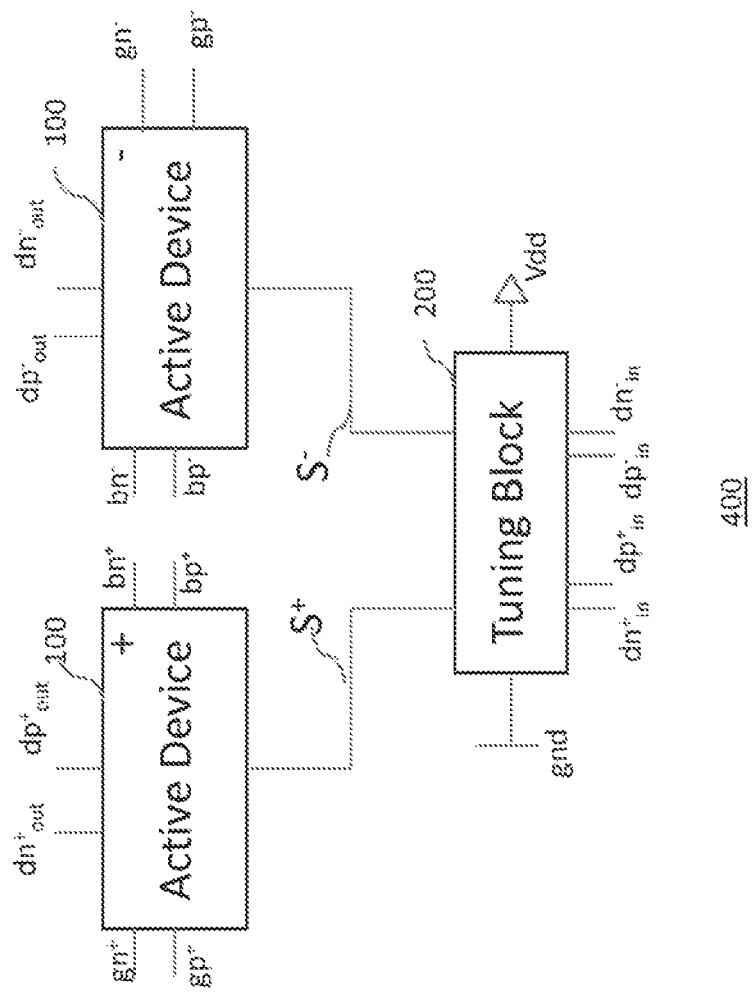
FIG. 4A is a block diagram of a first embodiment of a differential common gate amplifier in accordance with the present invention.

The present invention relates generally to wireless devices and more particularly to an amplifier circuits utilized in such devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

FIG. 1A is a schematic diagram of an active device 100 in accordance with the present invention. The active device 100 includes a n-type transistor 102 which includes a gate (gn), drain (dn) and bulk (bn) and a p-type transistor 104 which includes a gate (gp), drain (dp) and bulk (bp). The n-type transistor 102 and the p-type transistor 104 share a common source (s). The active device 100 includes a first capacitor 106 coupled between gn and gp, a second capacitor 108 coupled between dn and dp; and a third capacitor 110 coupled between bn and bp. The active device 100 has a high breakdown voltage due to the four terminals (gate, drain bulk and source), is memory-less and traps even harmonic signals when utilized with certain amplifiers such as Class AB amplifiers.

FIG. 1B is a block diagram of the active device 100 shown in FIG. 1A. The n-type transistor 102 can be NPN bipolar or any other active element from GaAs. The p-type transistor 104 can be PNP bipolar or any other active complementary from GaAs. The n-type transistor 102, can further be protected by a cascade NMOS circuit. The p-type transistor 104 can farther be protected by a cascade PMOS circuit. Capacitor 106 can be a variable capacitor, it can have a series resistor and or series inductor all being variable. Capacitor 106 can further be split into N number of capacitors with any series elements. Capacitor 108 can be a variable capacitor, it can have a series resistor and or series inductor ail being variable. Capacitor 108 can further be split into N number of capacitors with any series elements. Capacitor 110 can be a variable capacitor, it can have a series resistor and or series inductor all being variable. Capacitor 110 can further be split into N number of capacitors with any series elements.

More capacitors can be coupled (parasitic or non-parasitic) from dn to gn, dn to gp, dp to gp, dp to gn. These capacitors can be variable and or have series passive or active elements such as inductor, resistor, transformers and so on. Node gp can connect to a bias network. This bias network can include any passive, such as resistor, capacitor, inductor, transformer and any combinations of them. The bias can also include any active elements.

In the case of using cascode transistor for both n-type and p-type or either one, additional capacitors may be needed to connect drain of cascode n-type to drain of cascade p-type similar to capacitor 110. Also a capacitor coupling a bulk of cascade n-type to a bulk of cascode p-type may be similar to capacitor 108. In addition, a capacitor can be connected from gate of cascode n-type to the gate of cascade p-type similar to capacitor 106.

If device 100 in FIG. 1A is driven in class AB or B or C or D or any other class except class A, then the active device 100 generates even and odd harmonic output currents flowing through dn and dp nodes. Active device 100 can distinguish between even and odd harmonics by generating similar direction current flow at nodes dn and dp in case of odd harmonics such as main signal or $3^{rd}$ harmonic. However active device 100 will generate opposing direction currents at node dn and dp for even harmonic such as $2^{nd}$, $4^{th}$, $6^{th}$ and so on. Also a filtering action caused by capacitors 110, 108 and 106 will effect magnitude of even harmonics flowing through dn and dp nodes.

The active device 100 can be utilized in conjunction with a tuning block to provide an amplifier that provides a linear output signal. Following is a description of two basic single ended tuning blocks that can be utilized in conjunction with the active device 100.

FIG. 2A is a first embodiment of a tuning block 200 in accordance with the present invention. The single ended tuning block 200 includes two inputs dn and dp, one output, s and a voltage supply, (vdd) and ground, (gnd). Input signals in the form of current can be provided to nodes dn and dp, as I_in_n and I_in_p respectively. The tuning block 200 which can include a combination of all or few part of passive, inductors, capacitors, resistors and transformers but not limited to any has a function of receiving I_in_n and I_in_p and providing an output current, I_s at node S with following condition: I_s>I_in_n+I_in_p. The tuning block 200 is utilized to provide a linear output signal regardless of the power. A combination of tuning block 200 and the active device 100, form a common gate amplifier.

FIG. 3A is a block diagram of a single ended common gate amplifier in accordance with the present invention. The common gate amplifier comprises the active device 100 coupled to the tuning block 200. In this embodiment, current I_s from the tuning block 200 is provided to the source connection, S of the active device 100. Due to a common gate action of device 100, the current I_s will split and a portion of it is directed to dn as output current I_out_n and the other portion directed to dp as output current I_out_p. The gates gn and gp of the active device 100 are coupled to bias lines. (No signal is applied to gn and gp). Bulk nodes, bn and bp are also coupled to their respective bias lines.

In the case when the active device 100 is operating under class AB, B, C, D and F mode, other even and odd harmonics current generate internal to the active device 100. These currents are directed toward dn and dp. For even harmonics such as AM (Amplitude modulated) currents and $2^{nd}$ harmonics the direction of current flow through dn and dp are opposite. However for odd harmonics, such as main signal current and $3^{rd}$ harmonics, direction of output currents through dn and dp are the same.

FIG. 2B is a second embodiment of a tuning block 200' in accordance with the present invention. The single ended tuning block 200' includes of two inputs dn and dp, three outputs, s, gn and gp. The single ended tuning block 200' has a supply (vdd), and ground (gnd). Input signal in the form of current is inserted to nodes dn and dp with I_in_n and I_in_p respectively. Tuning block 200' which can includes a combination of all or few part of passive, inductors, capacitors, resistors and transformers but not limited to any has a function of receiving I_in_n and I_in_p and then provide an output current, I_s at node S with following condition: I_s>I_in_n+I_in_p. the output gp and gn are voltages which will drive gn and gp nodes of the active device 100. As shown in FIG. 3B, combining tuning block 200' with active device 100, form a common-gate/common source amplifier action.

In addition, tuning block 200' may only send gate information gn and gp and no information at S node. In this case, S node can be grounded or coupled to any passive device such as resistor, capacitor, inductor, transformer or active device or all. Combination of tuning block 200' and active device 100, in this particular case form a common-source amplifier.

FIG. 3B is a block diagram of a combined common gate and common source amplifier in single ended form in accordance with the present invention. The common gate and common source amplifier comprises the active device 100 coupled to the tuning block 200'. In this embodiment, current I_s from the tuning block 200' is provided to the source connection, S of the active device 100. Due to common gate action of device for any current entering node s, the current I_s will split and portion of it directed to dn as output current I_out_n and the other portion directed to dp as output current I_out_p. The gates gn and gp of the active device 100 are coupled to bias lines as well as driven by output nodes of tuning block gn and gp. Bulk nodes, bn and bp are also coupled to their respective bias lines. Nodes gn and gp can further be connected to their respective bias which is isolated from main signal.

FIG. 4A is a block diagram of a first embodiment of a differential common gate amplifier 400 in accordance with the present invention. The amplifier 400 comprises a differential tuning block 200 coupled to a first and second active device 100. The differential tuning block 200 comprises four inputs dn_in+, dp_in+ and dn_in−, dp_in−, and two output, s s+ and s−. A supply (vdd) and a ground (gnd) is provided. Input signals in the form of current are inserted to nodes dn_in+, dp_in+ and dn_in−, dp_in− as I_in_n+, I_in_p− and I_in_n− and I_in_p− respectively. Tuning block 200 which can include a combination of all or few part of passive, inductors, capacitors, resistors and transformers but not limited to any has a function of receiving I_in_n+, I_in_p+ and I_in_n−, I_in_p− and process them as output currents I_s+ and I_s− at node S+ and S− respectively with following condition: I_s+>(I_in_n+)+(I_in_p+) and I_s−>(I_in_n−)+(I_in_p−)

In this embodiment current I_s from the tuning block 200 is provided to the source connection, S of the active device+ 100. Due to a common gate action of device 100+, the current I_s will split and a portion of it is directed to dn as output current I_out_n and the other portion directed to dp as output current I_out_p. The gates gn and gp of Active device are coupled to bias lines. (No signal is applied to gn and gp). Bulk nodes, bn and bp are also coupled to their respective bias lines.

Similarly, in this embodiment, current I_s from the tuning block 200 is provided to the source connection, S of the active device 100−. Due to a common gate action of device 100−, the current I_s will split and a portion of it is directed to dn as output current I_out_n and the other portion directed to dp as output current I_out_p. The gates gn and gp of Active device are coupled to bias lines. (No signal is applied to gn and gp). Bulk nodes, bn and bp are also coupled to their respective bias lines.

Any number of capacitors or variable capacitors can be coupled between + and − nodes of inputs and of tuning block 200. As well any number of capacitors or variable capacitors can connect between + and − nodes of input, outputs, gates, bulks to input and outputs of active device+ 100 and active device− 100. For example, cross capacitors or variable capacitors can be coupled between dn+ and dn−; dp+ and dp−; dn− and dp+; dn+ and dp− and or any combination thereof. Also these capacitors or variable capacitors can include series resistors or series inductance or parallel resistors or parallel inductors which do not affect or alter the invention.

Figure 4B:
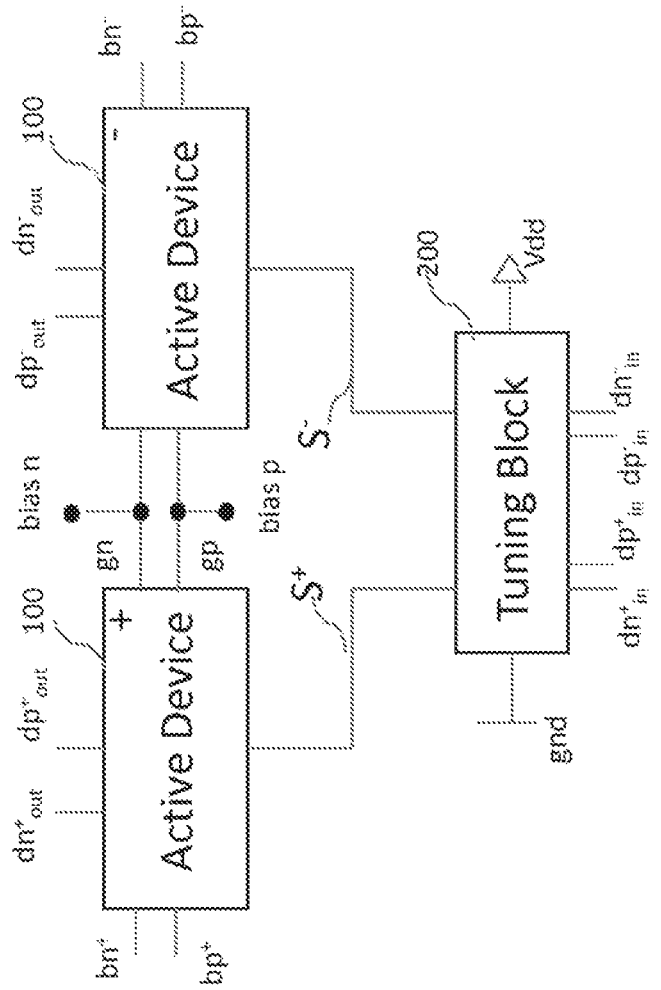
FIG. 4B is a block diagram of a second embodiment of a differential common gate amplifier in accordance with the present invention.

FIG. 4B is a block diagram of a second embodiment of a differential common gate amplifier in accordance with the present invention. The amplifier 400 comprises a differential tuning block 200 coupled to a first and second active device 100. The differential tuning block 200 comprises four inputs dn_in+, dp_in+ and dn_in−, dp_in−, and two output, s s+ and s−. A supply (vdd) and a ground (gnd) is provided. Input signals in the form of current are inserted to nodes dn_in+, dp_in+ and dn_in−, dp_in− as I_in_n+, I_in_p− and I_in_n− and I_in_p− respectively. A supply vdd in the left and gnd to the right. Tuning block 200 which can include a combination of all or few part of passive, inductors, capacitors, resistors and transformers but not limited to any has a function of receiving I_in_n+, I_in_p+ and I_in_n−, I_in_p− and process them as output currents I_s+ and I_s− at node S+ and S− respectively with following condition: I_s+>(I_in_n+)+(I_in_p+) and I_s−>(I_in_n−)+(I_in_p−).

In this embodiment, current I_s from the tuning block 200 is provided to the source connection, S of the active device+ 100. Due to a common gate action of device 100+, the current I_s will split and a portion of it is directed to dn as output current I_out_n and the other portion directed to dp as output current I_out_p. The gates gn and gp of Active device are coupled to bias lines forming a virtual ground between + and − side (No signal differential signal is applied to gn and gp). Bulk nodes, bn and bp are also coupled to their respective bias lines.

Similarly, in this embodiment, current I_s from the tuning block 200 is provided to the source connection, S of the active device 100−. Due to a common gate action of device 100−, the current I_s will split and a portion of it is directed to dn as output current I_out_n and the other portion directed to dp as output current I_out_p The gate gn− is coupled to gate gn+ to form a virtual ground and they share a common bias voltage, vbias_n. Similarity, gp− and gp+ are coupled together to form a virtual ground and they share a common bias voltage, bias_p. Bulk nodes, bn− and bp− are also coupled to their respective bias lines.

Any number of capacitors or variable capacitors can be coupled between + and − nodes of inputs and outputs of tuning blocks 200. As well any number of capacitors or variable capacitors can connect between + and − nodes of input and outputs, gates, bulks and sources of active device+ 100 and Active device− 100. For example, cross capacitors or variable capacitors can be coupled between dn+ and dn−; dp+ and dp−; dn− and dp+; dn+ and dp− or any combination thereof. Also these capacitors or variable capacitors can include series resistors or series inductance or parallel resistors or parallel inductors which do not affect or alter the invention.

FIG. 4C is a block diagram of an embodiment of a differential combined common gate and common source amplifier in accordance with the present invention. The amplifier 400 comprises a differential tuning block 200 coupled to a first and second active device 100. The differential tuning block 200 comprises four inputs n+, p+ and n−, d− and 6 outputs s+, s−, gn+, gn−, gp+, gp−. Also a supply vdd and gnd is provided for needed biasing of any active device that is feeding nodes dn+, dn−, dp+ and dp−.

Input signals are in the form of current and are provided to nodes n+, p+ and n−, p− as I_in_n+, I_in_p+ and I_in_n− and I_in_p− respectively. Tuning block 200 which can include a combination of all or some of passive devices s such as inductors, capacitors, resistors and transformers but not limited to any has a function of receiving I_in_n+, I_in_p+ and I_in_n−, I_in_p− and process them as output currents I_s+ and I_s− at node S+ and S− respectively with following condition: I_s+>(I_in_n+)+(I_in_p+) and I_s−>(I_in_n−)+(I_in_p−)

The other four output nodes of the tuning block 200 connect to positive and negative n-type and p-type gates of active device+ 100 and active device− 100 respectively to form a differential common gate-common source amplifier.

Current I_s+ provided to active device+ 100 source connection, S. Due to common gate action of this device, the current I_s+ will spilt and portion of it is directed to dn+ as output current I_out_n+ and the other portion directed to dp+ as output current I_out_p+. The gates gn+ and gp+ of active device+ 100 are coupled to bias lines. (No signal is applied to gn+ and gp+). Bulk nodes, bn+ and bp+ are also coupled to their respective bias lines.

Similarly, current I_s− is entering active device− 100 source connection, S. Due to a common gate action of active device− 100, the current I_s− will split and portion of it is directed to dn− as output current I_out_n− and the other portion directed to dp− as output current I_out_p−.

Any number of capacitors or variable capacitors can connect between + and − nodes of inputs and outputs, gates and bulks and sources of tuning block 200. As well any number of capacitors or variable capacitors can connect between + and − nodes of input and outputs of active device+ 100 and Active device− 100. For example, cross capacitors or variable capacitors can connect between dn+ and dn−; dp+ and dp−; dn− and dp+; dn+ and dp− and any combination thereof. Also these capacitors or variable capacitors can include series resistors or series inductance or parallel resistors or parallel inductors, which do not affect or alter the invention.

Figure 5A:
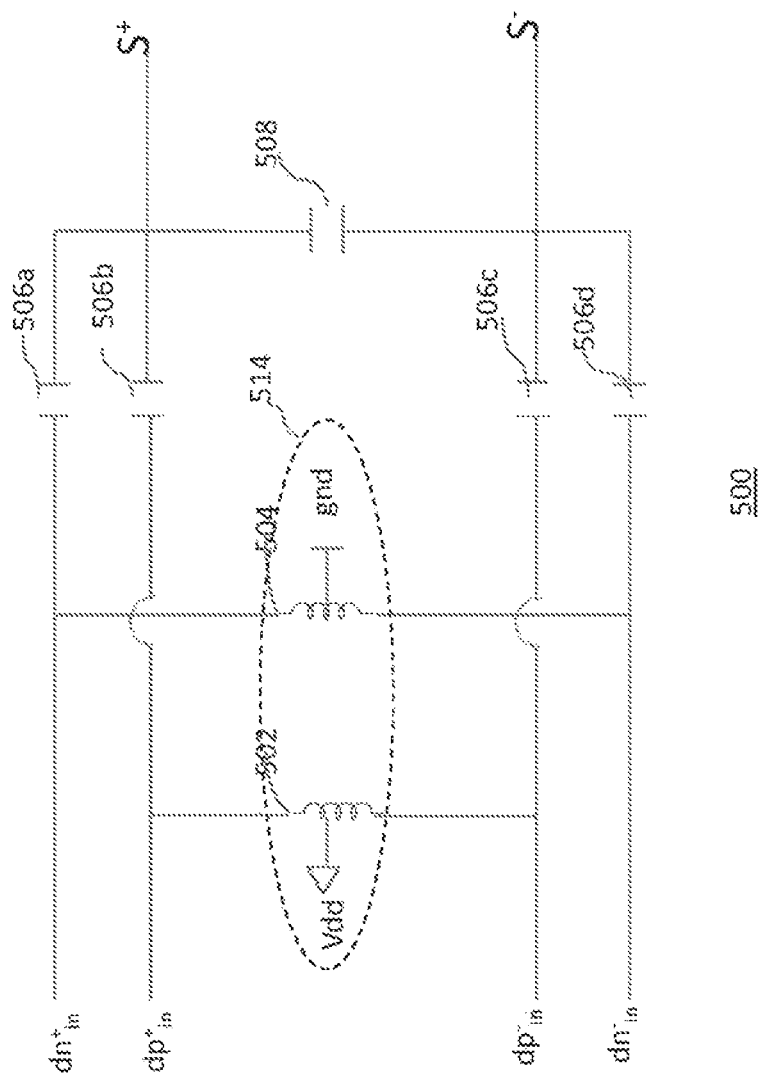
FIG. 5A is a schematic diagram of a coupled inductor capacitor tapped tuning block in accordance with the present invention.

FIG. 5A is a schematic diagram of a differential coupled inductor capacitor tapped tuning block 500 in accordance with the present invention. This is one example of a differential tuning block 200 with four inputs and two outputs and vdd and gnd that was shown in FIG. 4A.

As is seen the tuning block 500 includes capacitors 506a-506d. The main function of this tuning block 500 is to amplify current in exchange for reducing voltage from input to output such that power is not increased. The use of four inputs with coupled inductors 502 and 504 is a key feature of this implementation.

If this tuning block 500 is driven by differential active devices 100 as shown in FIG. 1A to 4C, and if the active devices 100 are operating in class AB or B, C, D, E, F which produce combinations of even and odd harmonics, coupled inductors 502 and 504 play an important role. The inductors 502 and 504 enhance for odd harmonics or differential mode and cancel by the strength of coupling factor for the even harmonics. In so doing, the tuning block 500 acts normally for odd harmonics at a targeted center frequency and cancels even harmonics as the circuit imposes higher center frequency for even harmonics while not coupling even harmonic information from both primary to secondary.

Inductors 502 and 504 can be fully coupled or partially coupled. Also they can be with different inductance value such as different turn ratio. The coupled inductance also reduces an inductance path from dn+, dp+ and dn−, dp− to power supply, vdd and ground, and lines, enhancing performance.

Figure 5B:
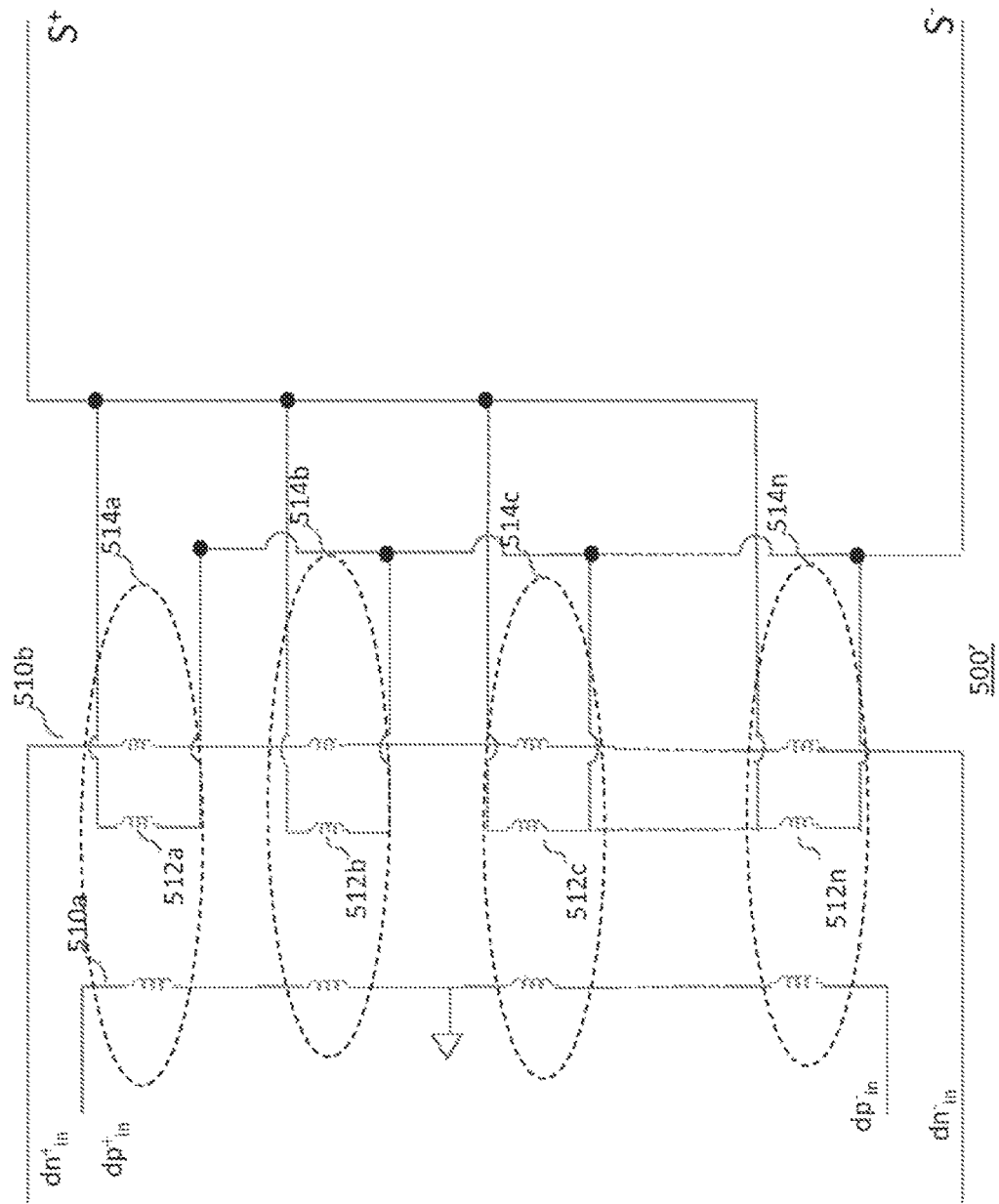
FIG. 5B is a schematic diagram of a coupled transformer combined tuning block in accordance with the present invention.

FIG. 5B is a schematic diagram of a differential coupled transformer combined tuning block 500' in accordance with the present invention. Inductor set of 510a connected between p+ and p− and inductor set of 510b connected between n+ and n− form two primary winding of the transformer. The two primary windings 510a and 510b may or may not be coupled together. The N sectioned inductors 512a, 512b, 512c, and 512d form the secondary winding of the transformer. The secondary sections can be all equal to each other or different. The secondary inductors can couple (shown at 514a-514n) to primary inductor 510a or 510b or both.

Positive and negative nodes of each sectioned inductors are connected together respectively to form S+ and S− output nodes. Since current through each section of inductor 512a, 512b, 512c, . . . 512d are equal to current through primary 510a plus 510b, then total current at S+ and S− is:

$$Iout=N*(I\_in\_p+I\_in\_n).$$

Also voltage across S+ and S− is N times smaller than a voltage across primary lines n+, n− and p+, p−. Capacitors can be coupled from dn+ to dn−, dp+ to dp− and S+ to S−. Also capacitors can be coupled from dn+ to p+, dn− to p− and dn+ to dp− and dp+ to dn− and capacitors from S+ to dn+ and dp+ and S− to dp− and dn− and any combination thereof. These capacitors can be variable capacitors, they can be N parallel capacitors. They can have series resistors or inductors or switches.

Figure 5C:
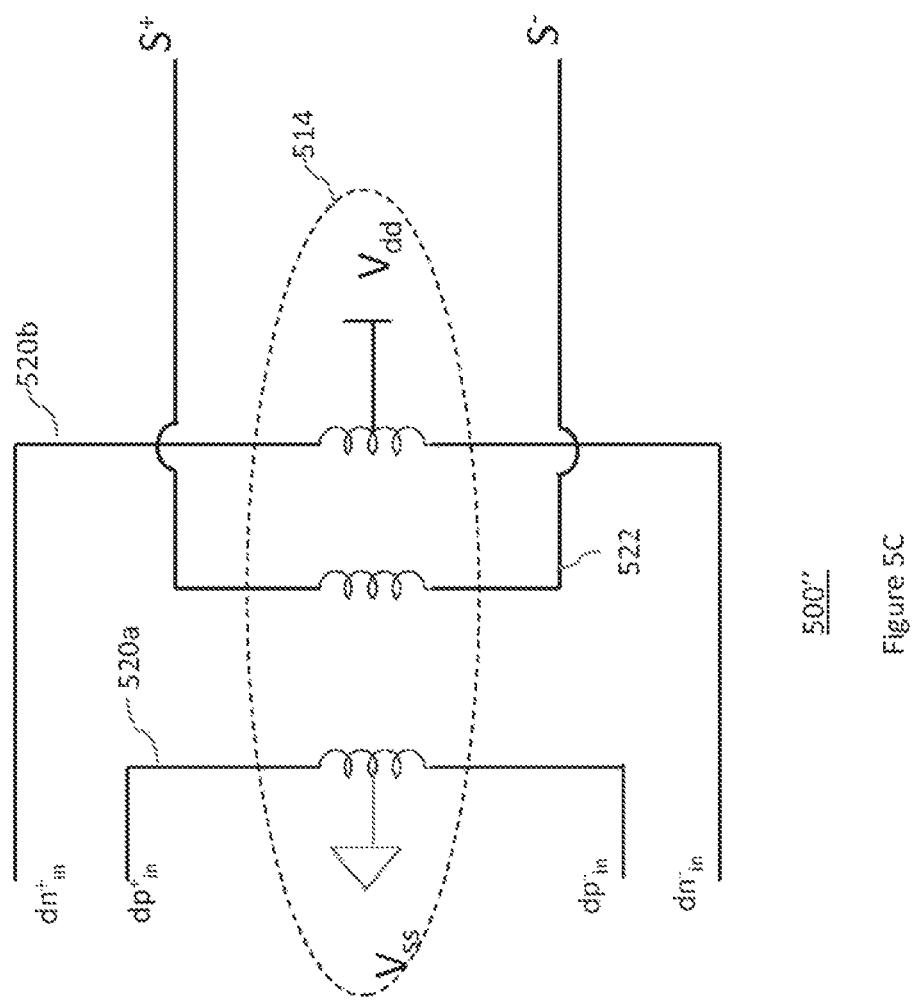
FIG. 5C is a schematic diagram of a coupled transformer turn ratio tuning block in accordance with the present invention.

FIG. 5C is a schematic diagram of a differential coupled transformer turn ratio tuning block 500" in accordance with the present invention. Another example of a tuning circuit that amplify current in exchange to reducing voltage, is the transformer with different turn ratio of primary larger then turn ration of secondary. In other words, inductance 520a and 520b of primary are larger then inductance 522 of secondary. This is not new. However if two primary inductors 520a and 520b are coupled together shown at 514 that can be driven with the active device+ 100 and the active device− 100 is unique to this invention. The center taps; vdd and vss are for biasing Active device+ and Active device− of previous stage. The circuit may or may not need it. Also any circuit, passive or active can be coupled to vdd and vss center taps. Output current, Iout=M*(I_in_p+I_in_n) with M related to ratio of primary inductor and secondary, coupling coefficient and Q loss of passives in this network.

Capacitors can be coupled from dn+ to dn−, dp+ to dp− and S+ to S−. Also capacitors can be coupled from dn+ to dp+, dn− to dp− and dn+ to dp− and dp+ to dn− and capacitors from S+ to dn+ and dp+ and S− to dp− and dn−. And any combination thereof. These capacitors can be variable capacitors, they can be N parallel capacitors. They can have series resistors or inductors or switches.

Figure 6A:
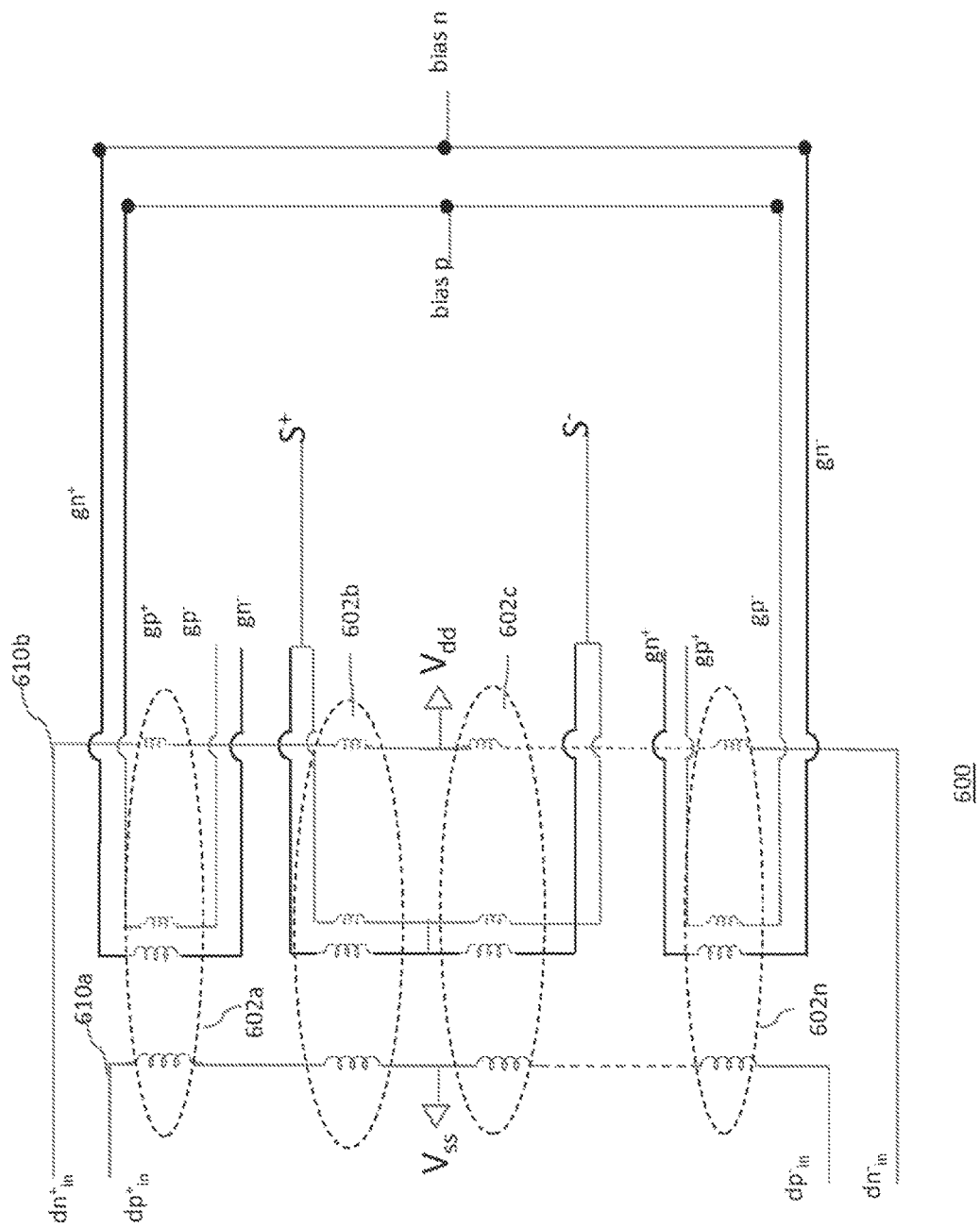
FIG. 6A is a schematic diagram of a coupled transformer with sectional secondary winding tuning block in accordance with the present invention.

FIG. 6A is a schematic diagram of a differential coupled transformer 600 with sectional secondary winding tuning block in accordance with the present invention. The differential coupled transformer of FIG. 6A is one implementation example of passive network which takes four inputs as dn+; dp+ and dn−, dp− and six outputs of S+, S−; gn+, gn−: gp+, gp− in such a manner that with proper sizing of inductors and capacitors, output currents at S− and S+, I_out_+ or I_out_− are larger than combined I_in_n+ and I_in_p+ or I_in_n− and I_in_p−. The nodes gn+, gn−, gp+ and gp− will connect to respective gates of active device 100 to initiate common gate, common source action in the active device 100.

An inductor set 610a that is connecting dp+ to dp− form first primary inductor set that are connecting dn+ to dn− form a second primary inductor set 610b. These primary inductor sets 610a and 610b can be coupled to each other with a coupling factor k and also to couple to secondary inductor sets for each section as shown in the dotted oval in FIG. 6A and indicated as sections 602a, 602b, 602c . . . 602n. Since primary inductors in each section couple together, the tuning block 600 block can distinguish between odd harmonic and even harmonic of the signal and therefore behave differently for each case. In the odd harmonic mode, direction of current through nodes dn+ and dp+ are same direction hence the current is coupled to the secondary inductors. Also the driving active or passive of previous stage sees full inductance of combined primary and secondary according to transformer action. In the even harmonic mode, the direction of current at node dn+ and dp+ are opposite to each other. Hence no current will couple to the secondary inductors. Also the inductance seen by between dn+, dn− and dp+, dp− is less than in the odd harmonic mode.

Figure 6B:
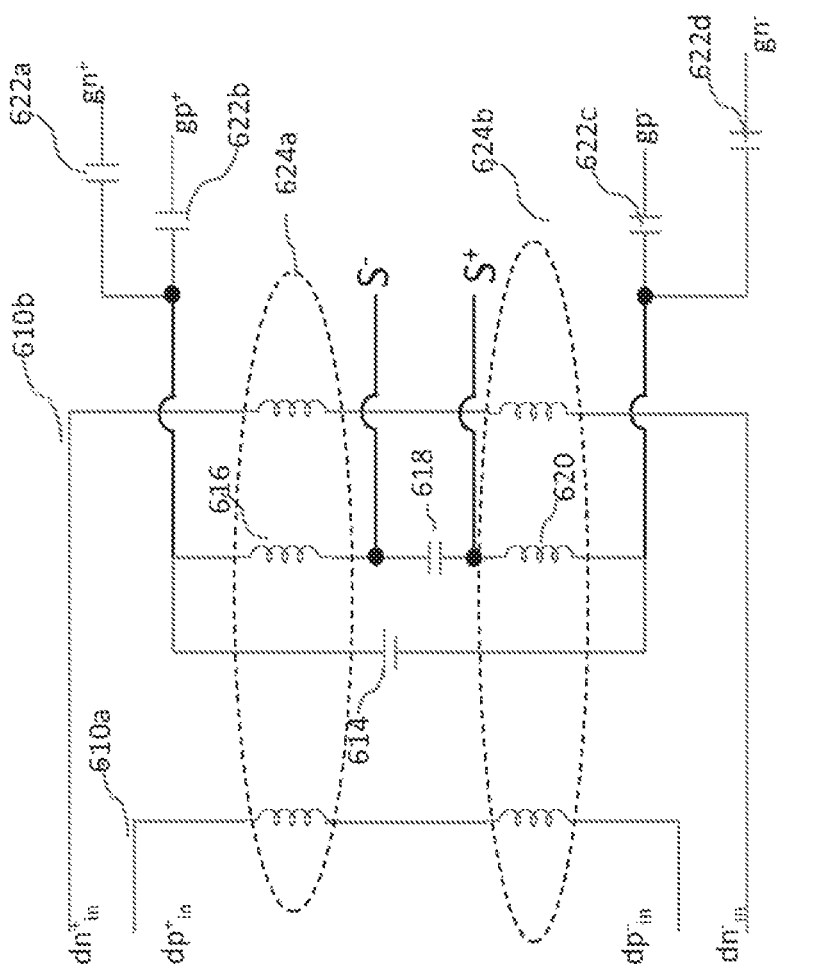
FIG. 6B is a schematic diagram of a coupled transformer with capacitance tuning block in accordance with the present invention.

FIG. 6B is a schematic diagram of a coupled transformer with capacitance tuning block 600' in accordance with the present invention. The tuning block 600 is one implementation example of a passive network which includes four inputs as dn+, dp+ and dn−, dp− and six outputs of S+, S−; gn+, gn−: gp+, gp−. The passive network is designed in such a manner that with proper sizing of inductors and capacitors, output currents at S− and S+, I_out_+ or I_out_− are larger then combined I_in_n+ and I_in_p+ or I_in_n− and I_in_p−. the nodes gn+, gn−, gp+ and gp− will connect to respective gates of the active device 100 so that to initiate common gate, common source action in the active device 100.

Inductor 610a is a primary inductor connecting p+ to p−. Inductor 610b is also primary connecting n+ to n−. These primary inductors 610a and 610b can be coupled to each other with a coupling factor k, such that circuit distinguish between odd harmonic and even harmonic of signal and behave differently for each case. In odd harmonic mode, direction of current through nodes dn+ and dp+ are same direction hence current add to the current of the secondary inductor 616 and 620 therefore seeing the full inductance of 610a and 610b via coupling 624a and 624b. The tuning block 600' includes capacitors 622a-622d, capacitor 614, and capacitor 618. For the signal in the even harmonic mode, direction of current at node dn+ and dp+ are opposite to each other. Hence no current will couple to secondary inductor 618 and 620. Also inductance seen between dn+, dn− and dp+, dp− is less than the odd harmonic mode.

Figure 7A:
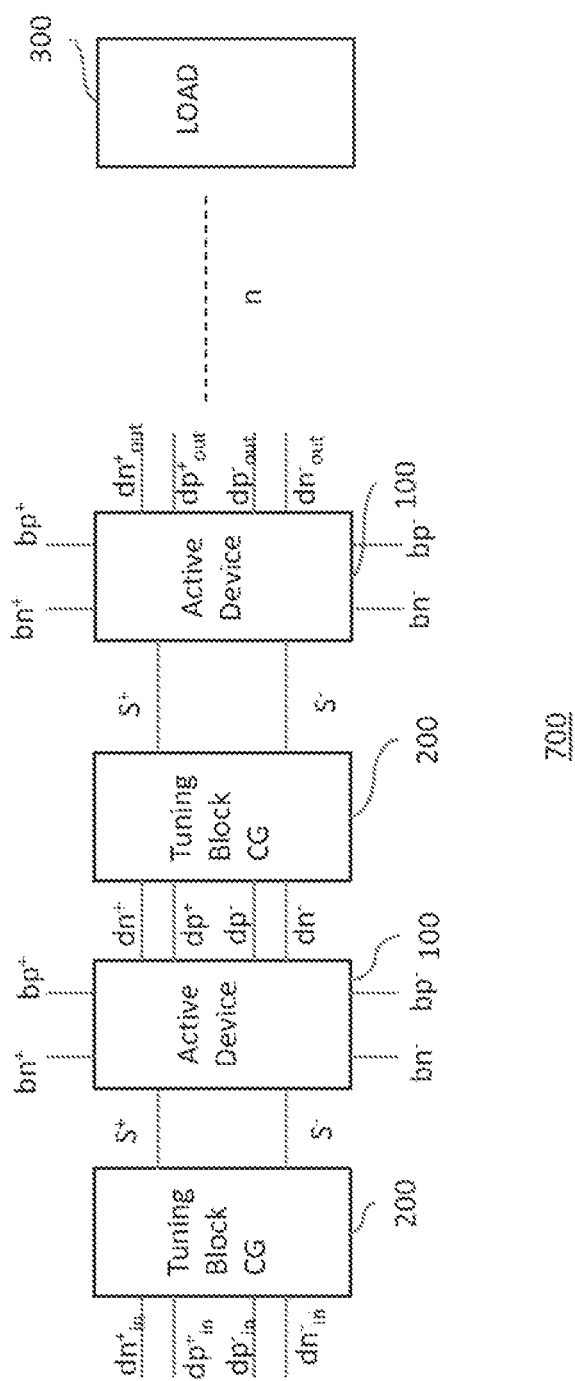
FIG. 7A is a diagram of a common gate power amplifier in accordance with the present invention.

FIG. 7A is a diagram of a common gate power amplifier 700 in accordance with the present invention. The amplifier 700 includes a plurality of common gate tuning blocks 200 alternately serially connected between active devices 100. The last active device is then terminated with a load 300.

Figure 7B:
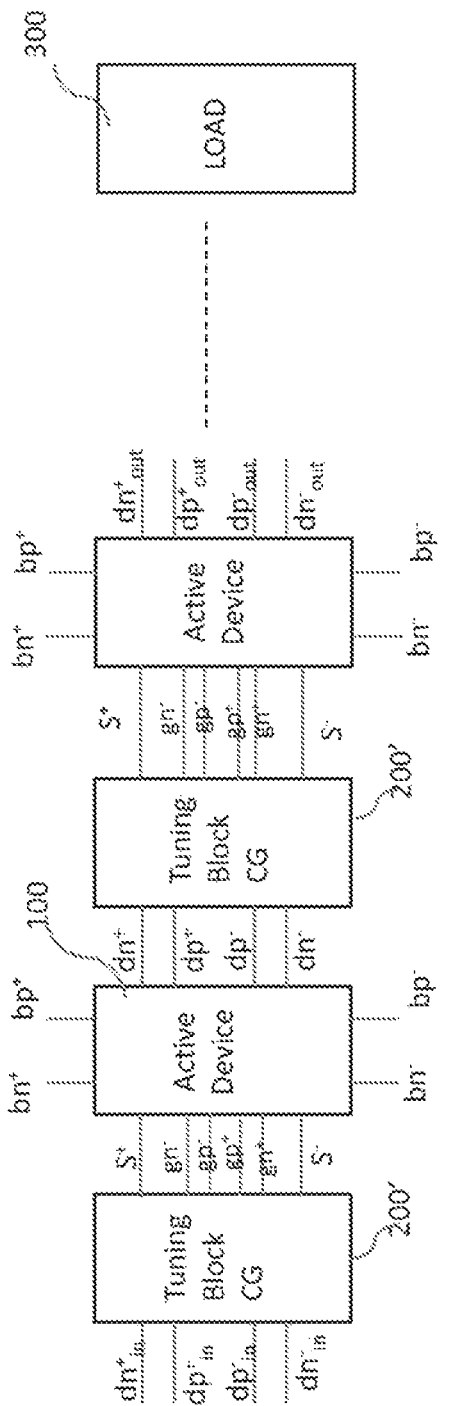
FIG. 7B is a diagram of a combined common gate and combined source power amplifier in accordance with the present invention.

FIG. 7B is a diagram of a combined common gate and common source power amplifier 700" in accordance with the present invention. The amplifier 700' includes a plurality of common gate and common source gate tuning blocks 200' alternately serially connected between active devices 100. The last active device 100 is then terminated with a load 300.

Figure 7C:
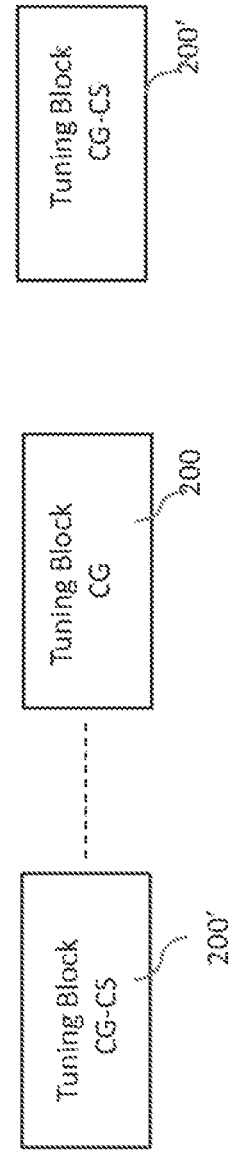
FIG. 7C is a diagram of a power amplifier that includes both a plurality of common gate amplifiers and a plurality of combined common gate and common source amplifiers in accordance with the present invention.

FIG. 7C suggests that mix and match of common gate or common gate, common source or even common source can be implemented that is in accordance with the present invention.

Figure 8:
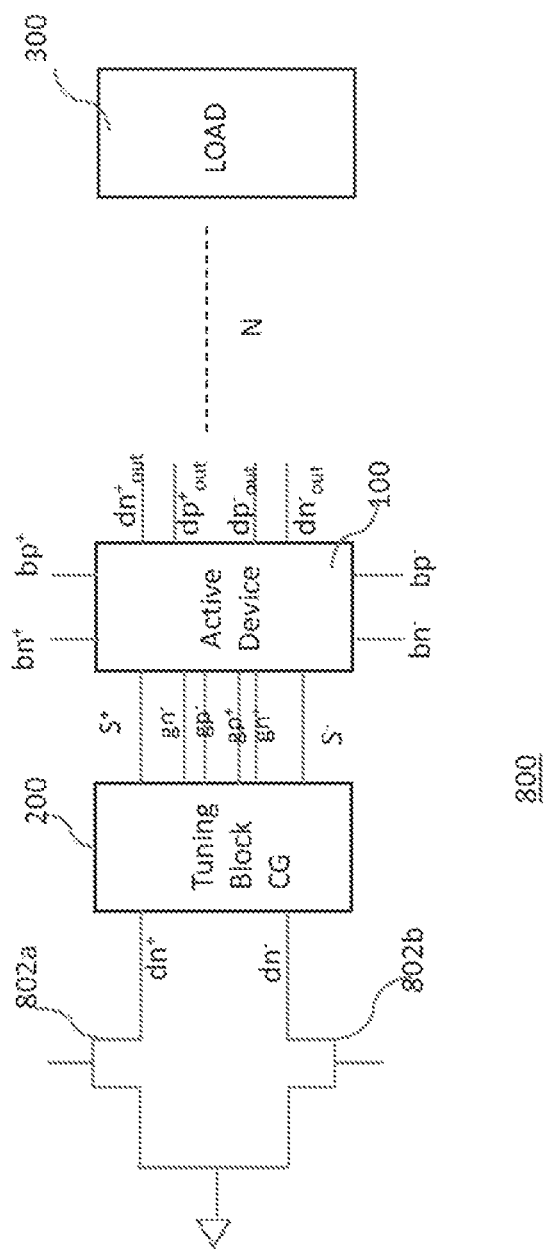
FIG. 8 is a block diagram of a power amplifier in accordance with the present invention.

FIG. 8 is a block diagram of a power amplifier 800 in accordance with the present invention. The amplifier 800 includes a pair of transistors 802a and 802b that deliver an input signal to tuning block 200. The tuning block 200 provides six outputs, gn−, gn+, gp−, gp+, S+ and S−. These signals are the inputs to the active device 100 which provides output signals dn+, dp+, dp− and dp− to the load 300. This means that invented common gate or common gate common source amplifier do not have to be driven by similar amplifier that is invented in this application. Any traditional common source or common gate transistors that are n-type or p-type or n-p type with or without cascades can also drive it. However performance is not optimum.

Figure 9:
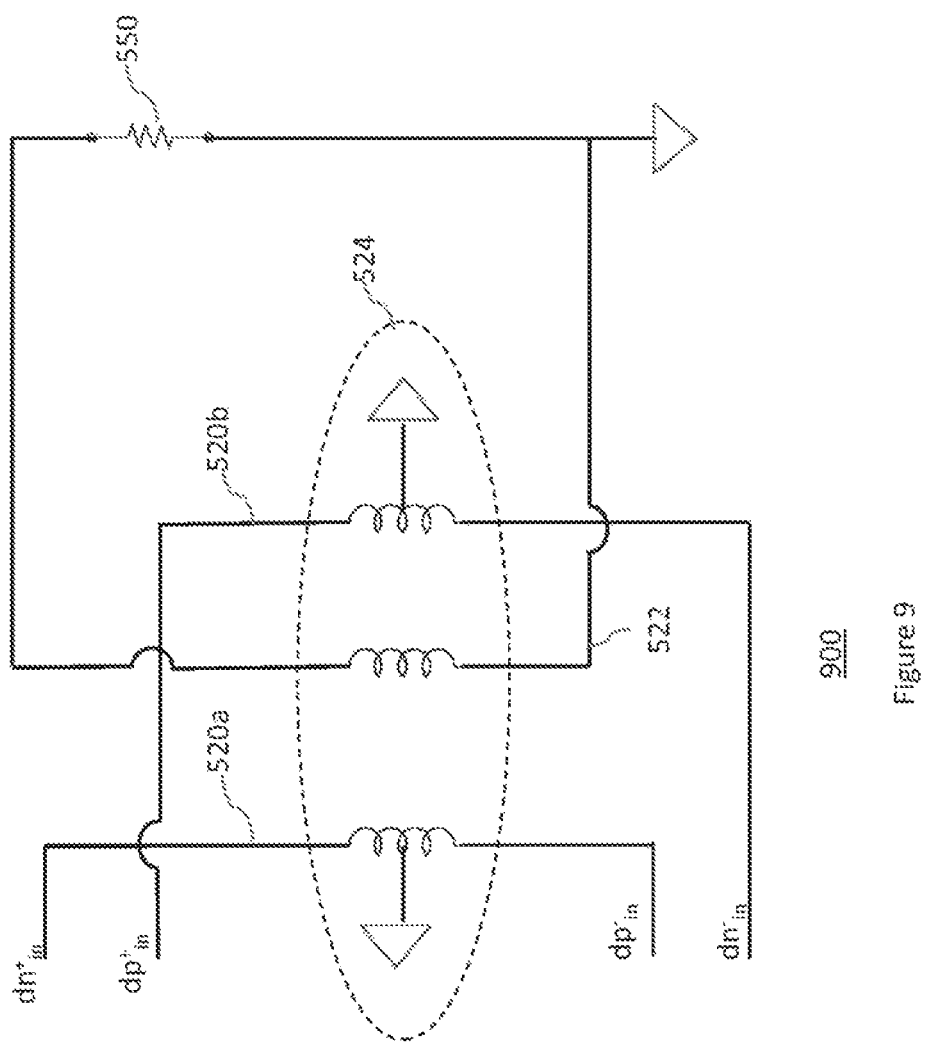
FIG. 9 is a first embodiment of a schematic diagram of the load of FIG. 8 in accordance with the present invention.

FIG. 9 is a first embodiment of a schematic diagram of the load of FIG. 8 in accordance with the present invention. FIG. 9 is an example of an output matching circuit 900 for the power amplifier which can differentiate between odd and even harmonics of a signal presented to nodes dn+, dn− and dp+, dp−. Inductors 520a and 520b are primary inductors. They are coupled together. Inductor 522 is secondary which is coupled to both 520a and 520b. The secondary is coupled to load 550. In an embodiment, the load 550 can be antenna or SAW filter as an example. Negative side of secondary 522 can be grounded which will convert a differential input to single ended output. Different turn ratio of secondary 520 to primary 520a and 520b can results to different matching set up.

The key feature is that two primary inductors 520a and 520b are coupled together. Due to the coupling 524, the inductance seen from nodes n+ to n− and p+ to p− is different for odd and even mode of input signal. If the output matching circuit is driven with active device+ and active device− 100, in the even mode, current direction between two primary inductance 520a and 520b are opposite. In the odd mode, current direction between two primary inductance 520a and 520b are same for normal operation. This greatly enhances performance.

Center taps vdd and vss are for providing proper bias for previous stage active devices. Capacitors can be coupled from dn+ to dn−, dp+ to dp− and S+ to S− to tune the matching transformer. Also capacitors can be coupled from dn+ to dp+, dn− to dp− and dn+ to dp− and p+ to n− and capacitors from S+ to dn+ and dp+ and S− to dp− and dn− and any combination thereof. These capacitors can be variable capacitors; they can be N parallel capacitors. They can have series resistors or inductors or switches.

FIG. 10A is a schematic diagram of a second embodiment of the load of FIG. 8 in accordance with the present invention. This is another example for output matching network referred to as a combiner network 1000. If this network 1000 is driven by N differential active device+ 100 and active device− 100, then direction of current flow through dn1+, dn1− side of primary is same direction to current flow through dp1+, dp1− for odd harmonic mode, hence normal operation in which input currents of dn1 and dp1 of primary 1020a add via coupling 1010a-1010n and couples to secondary 1022a-1022n via coupling 1010a-1010b with associated coupling factor and losses in consideration. However if this network is driven by differential active device+ 100 and active device− 100, then direction of current flow through dn+, dn− side of primary is opposite direction to current flow through p+, p− side of primary and hence has a cancelling effect in accordance to coupling factor and losses as well as reducing inductance seen between nodes dn1+, dn1− and dp1+, dp1−. These distinguishing of odd vs even harmonic of signal is a key feature of the present invention. The response of circuit for even and odd harmonic signals is also true for each sub sections. This action will greatly enhance performance especially for the issues related to memory effects and signal bandwidth. The secondary 1022*a*-1022*n* can be single ended by connecting one side of load to ground or differential.

Capacitors can be added between nodes dn1+ and dn1−, dp1+ and dp1−, dn1+ and dp1+, dn1− and dp1−, dn1+ and dp1−, dp1+ and dn1− and similarly to 2nd section and to N section. Also capacitors can connect to output+ and output−. Capacitors can also be variable. The capacitors can have series resistance and so forth. Each sub-section of combiner can independently shorted or disabled by any means, which can change load line seen by the driver. This will be done to change load characteristic for power amplifier for each power mode. Inductor value of each section can be same or different. The transform can be implemented on chip or off chip.

Figure 10B:
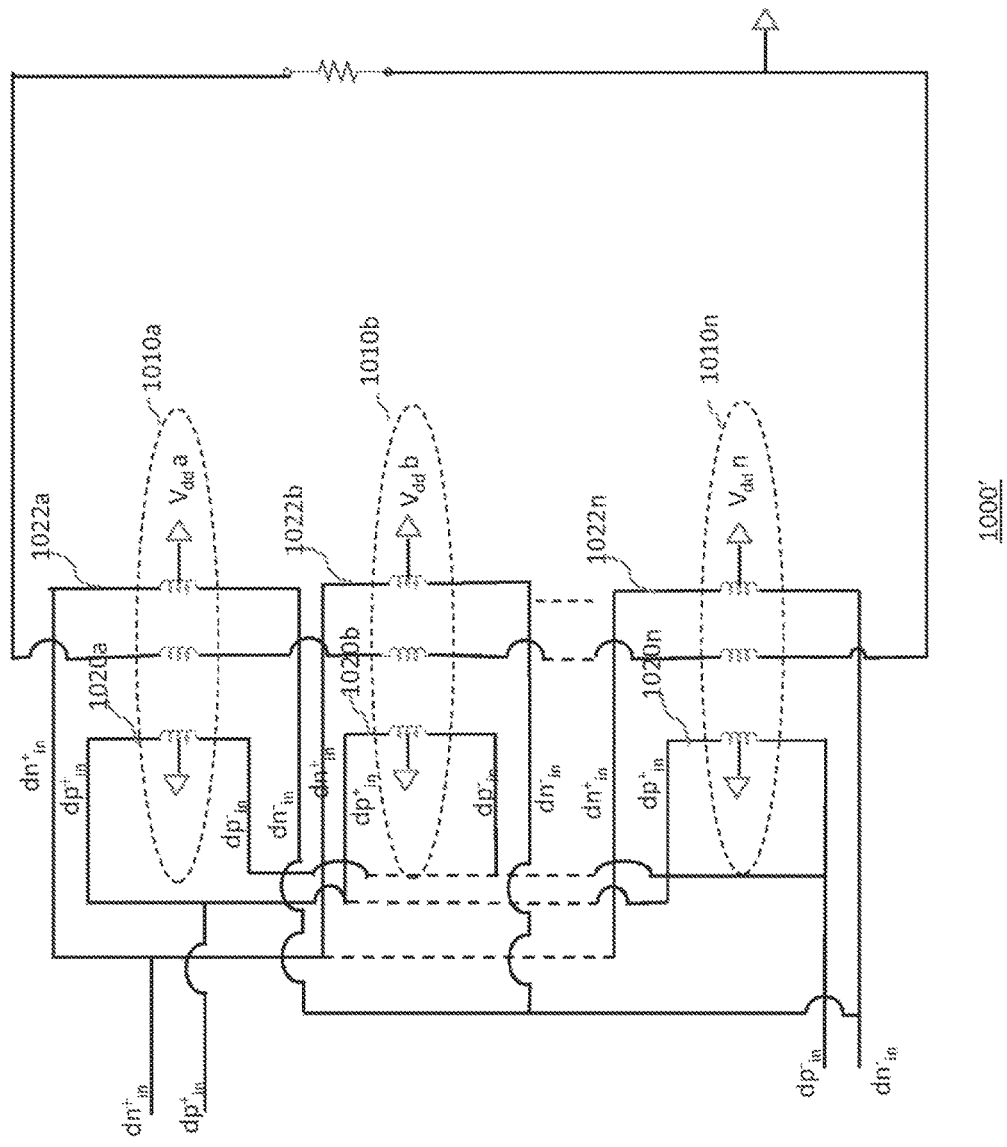
FIG. 10B is a second embodiment of a schematic diagram of the load of FIG. 8 in accordance with the present invention.

FIG. 10B is a schematic diagram of a third embodiment of the load of FIG. 8 in accordance with the present invention. This is another example for output matching network 1000'. The load is related to having two primary inductors, that are coupled together and by connecting equal potential input nodes together to even out any common mode differences between sub sections.

By connecting dn1+, dn2+, ... dnn+ together to form dn+ and dn1−, dn2−, ... dnn− together to form dn− and dp1+, dp2+, ... dpn+ together to form dp+ and dp1−, dp2−, ... dpn− together to form dp−.

This configuration reduces the number of inputs while increasing the performance. If this network is driven by a differential active device+ 100 and active device− 100, then the direction of current flow through dn+, dn− side of primary is same direction to current flow through dp+, dp− for odd harmonic mode, hence normal operation in which input currents of dn and dp of primary add and couples to secondary with associated coupling factor and losses in consideration. However if this network is driven by differential active device+ 100 and active device− 100, then direction of current flow through dn+, dn− side of primary is in an opposite direction to current flow through dp+, p− side of primary and hence has a cancelling effect in accordance to coupling factor and losses as well as reducing inductance seen between nodes dn+, dn− and dp+, dp−. This distinguish of odd vs even harmonic of signal is a key feature of the present invention. This action will greatly enhance performance specially for the issues related to memory effects and signal bandwidth.

The secondary can be single ended by connecting one side of load to ground or differential. Capacitors can be added between nodes dn+ and dn−, dp+ and dp−, dn+ and dp+, dp− and dp−, dn+ and ddp−, dp+ and dn−, output+ and output− and any combination thereof. The capacitors can be variable. The capacitors can have series resistance and so forth. Each sub section of combiner can independently shorted or disabled by any means, which can change load line seen by the driver. This will be done to change load characteristic for power amplifier for each power mode. Inductor value of each section can be same or different. The transform can be implemented on chip or off chip.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A differential common gate amplifier, comprising:
   a first active device coupled to a differential tuning block configured to receive a first input, a second input, a third input and a fourth input, the differential tuning block further configured to provide a first output and a second output, the first output being determined based at least in part on the first input and second input, the second output being determined based at least in part on the third input and the fourth input;
   a second active device coupled to the differential tuning block;
   wherein the first active device and the second active device each comprise:
   an n-type transistor;
   a p-type transistor;
   wherein the n-type transistor and the p-type transistor share a common source,
   wherein a first capacitor, a second capacitor, and a third capacitor are coupled between the n-type transistor and the p-type transistor.

2. The differential common gate amplifier of claim 1, wherein the first output is provided to the common source of the first active device and the second output is provided to the common source of the second active device.

3. The differential common gate amplifier of claim 1, wherein the first capacitor of the first active device and the second active device is coupled between a gate of the n-type transistor and a gate of the p-type transistor, wherein the second capacitor of the first active device and the second active device is coupled between a drain of the n-type transistor and a drain of the p-type transistor, wherein the third capacitor of the first active device and the second active device is coupled between a bulk of the n-type transistor and a bulk of the p-type transistor.

4. The differential common gate amplifier of claim 3, wherein each of the first, second and third capacitors of the first active device and the second active device comprises any of a variable capacitor, a capacitor coupled in series with a resistor, a capacitor coupled in parallel with a resistor, a capacitor coupled serially with an inductor, or a capacitor coupled in parallel with an inductor.

5. The differential common gate amplifier of claim 1, wherein the first active device is configured to provide a first output associated with a drain of the n-type transistor and a second output associated with a drain of the p-type transistor.

6. The differential common gate amplifier of claim 5, wherein the second active device is configured to provide a first output associated with a drain of the n-type transistor and a second output associated with a drain of the p-type transistor.

7. The differential common gate amplifier of claim 5, wherein a gate of the n-type transistor and a gate of the p-type transistor of the first active device are coupled to a first bias line; and wherein a gate of the n-type transistor and a gate of the p-type transistor of the second active device are coupled to a second bias line.

8. The differential common gate amplifier of claim 5, wherein a gate of the n-type transistor and a gate of the p-type transistor of the first active device are coupled to the differential tuning block; and wherein a gate of the n-type transistor and a gate of the p-type transistor of the second active device are coupled to the differential tuning block.

9. The differential common gate amplifier of claim 5, wherein a bulk of the n-type transistor of the first active device and a bulk of the n-type transistor of the second active device are coupled together to form a first virtual ground; and wherein a bulk of the p-type transistor of the first active device and a bulk of the p-type transistor of the second active device are coupled together to form a second virtual ground.

* * * * *